US010211950B1

(12) United States Patent
Hodzic

(10) Patent No.: US 10,211,950 B1
(45) Date of Patent: Feb. 19, 2019

(54) HIGH BIT RATE MEDIA FEC RECOVERY

(71) Applicant: Harmonic, Inc., San Jose, CA (US)

(72) Inventor: Edin Hodzic, Pleasanton, CA (US)

(73) Assignee: Harmonic, Inc., San Jose, CA (US)

( * ) Notice: Subject to any disclaimer, the term of this patent is extended or adjusted under 35 U.S.C. 154(b) by 119 days.

(21) Appl. No.: 15/160,248

(22) Filed: May 20, 2016

(51) Int. Cl.
*H04L 1/00* (2006.01)
*H03M 13/11* (2006.01)
*H03M 13/37* (2006.01)
*H03M 13/29* (2006.01)
*G06F 17/30* (2006.01)
*H04L 12/26* (2006.01)

(52) U.S. Cl.
CPC .......... *H04L 1/0045* (2013.01); *H03M 13/11* (2013.01); *H03M 13/116* (2013.01); *H03M 13/373* (2013.01); *H04L 1/0041* (2013.01); *H04L 1/0057* (2013.01); *G06F 17/30324* (2013.01); *G06F 17/30353* (2013.01); *H03M 13/2912* (2013.01); *H04L 43/106* (2013.01)

(58) Field of Classification Search
CPC ............. H03M 13/373; H03M 13/116; H03M 13/2912; H03M 13/11; H04L 1/0057; H04L 1/0041; H04L 1/0045; H04L 12/2684; H04L 43/106; G06F 17/30324; G06F 17/30353
USPC .......................... 714/749, 750, 752, 776, 786
See application file for complete search history.

(56) References Cited

U.S. PATENT DOCUMENTS

| 8,419,547 B1 * | 4/2013 | Radek ............... H03M 13/2942 370/389 |
| 8,972,815 B1 * | 3/2015 | Hwee .................. H03M 13/373 714/746 |
| 2002/0164024 A1 * | 11/2002 | Arakawa ........... H04L 29/06027 380/210 |
| 2008/0002580 A1 * | 1/2008 | Kawada ................ H04L 1/0009 370/231 |
| 2009/0016228 A1 * | 1/2009 | Ichiki ................ H03M 13/2909 370/241 |
| 2010/0023842 A1 * | 1/2010 | Rahrer .............. H03M 13/3761 714/776 |
| 2010/0251060 A1 * | 9/2010 | Doi ................... H03M 13/2906 714/752 |

(Continued)

*Primary Examiner* — Albert Decady
*Assistant Examiner* — Osman M Alshack
(74) *Attorney, Agent, or Firm* — Brokaw Patent Law PC; Christopher J. Brokaw

(57) ABSTRACT

Approaches for recovering one or more media datagrams. A plurality of media datagrams, a plurality of row forward error correction (FEC) datagrams, and a plurality of column FEC datagrams are received. The plurality of media datagrams is logically arranged in rows and columns of media datagrams. Each row FEC datagram corresponds to one of the rows of the media datagrams and each column FEC datagram corresponds to one of the columns of media datagrams. Each received datagram is stored in a buffer. Upon determining that a particular media datagram is missing, it is determined whether a particular row FEC datagram or a particular column FEC datagram covering the particular media datagram has been received and is missing only a single media datagram for which it covers. If so, then, the particular media datagram is recovered using the particular row FEC datagram or the particular column FEC datagram.

18 Claims, 6 Drawing Sheets

(56) References Cited

U.S. PATENT DOCUMENTS

| | | | | |
|---|---|---|---|---|
| 2012/0151291 A1* | 6/2012 | Sugimoto | ............. | H04L 1/1812 |
| | | | | 714/746 |
| 2013/0185614 A1* | 7/2013 | Shen | ..................... | H04L 1/0046 |
| | | | | 714/784 |
| 2015/0026542 A1* | 1/2015 | Brennum | .............. | H04L 65/605 |
| | | | | 714/776 |
| 2016/0149667 A1* | 5/2016 | Ranatunga | .......... | H03M 13/353 |
| | | | | 714/774 |
| 2016/0164545 A1* | 6/2016 | Ranatunga | ............ | H04L 1/0041 |
| | | | | 714/752 |

\* cited by examiner

HIGH BIT RATE MEDIA FEC RECOVERY

FIELD OF THE INVENTION

Embodiments of the invention generally relate to recovery of media datagrams.

BACKGROUND

Certain transport protocols may implement forward error correction (FEC) to recover dropped packets without requiring retransmission. SMPTE 2022 is a standard from the Society of Motion Picture and Television Engineers (SMPTE) that describes how to send digital video over an IP network. The SMPTE 2022-5 standard specifies a format for Forward Error Correction (FEC) for Transport of High Bit Rate Media Signals over IP Networks (HBRMT). The SMPTE 2022-5 standard does not specify any particular means for carrying out Forward Error Correction (FEC).

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for recovering one or more media datagrams are presented herein. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

Media and FEC Datagrams

A datagram is a basic transfer unit associated with a packet-switched network. The delivery, arrival time, and order of arrival of datagrams are generally not guaranteed by the network. A media datagram, as used herein, refers to a datagram carrying digital video data. A FEC datagram, as used herein, refers to a datagram that carries forward error correction (FEC) data.

For purposes of generality, when transmitting digital video over a packet-switched network, media datagrams carrying the digital video will be discussed herein as being delivered from a sender to a receiver. In addition to media datagrams, the sender will also transmit FEC datagrams to the receiver. FEC datagrams can be used by the receiver to reconstruct or recover a missing media datagram which the received failed to receive.

Figure 1:
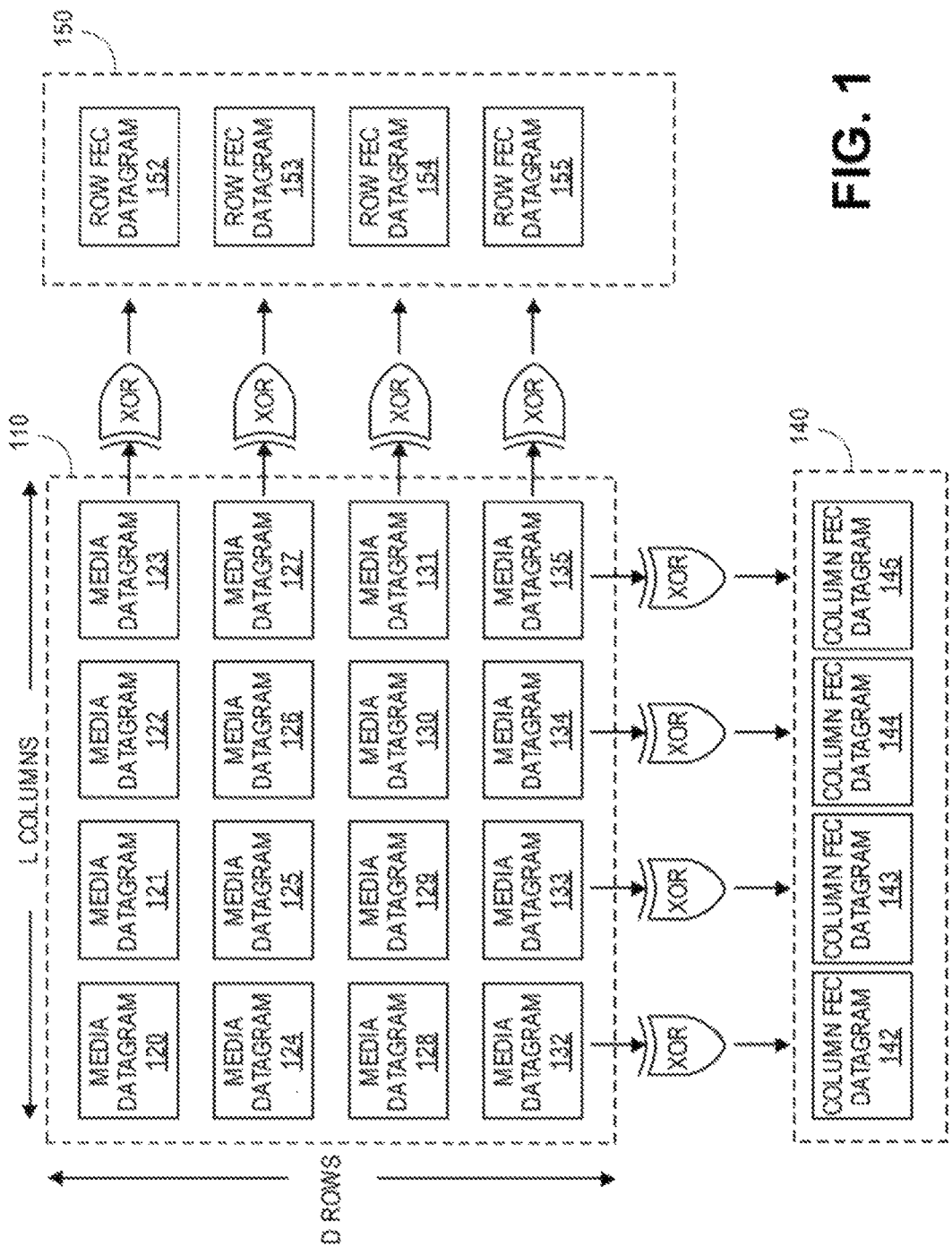
FIG. 1 is an illustration of a sequence of media datagrams logically organized in rows and columns.

To illustrate how FEC datagrams may be used to recover missing media datagram packets, consider FIG. 1, which is an illustration of a sequence of media datagrams 110 received at a receiver. The SMPTE 2022-5 and SMPTE 2022-6 specifications define a certain structure for media datagrams, which calls for media datagrams to be logically organized in a grid of rows and columns for purposes of performing forward error correction (FEC). For example, the logical organization for sequence of media datagrams 110 is graphically depicted in FIG. 1 as being arranged in a grid of L columns and D rows. Note that this is purely a logical arrangement, as at no time are datagrams physically manipulated into a grid. The purpose of the logical arrangement of the sequence of media datagrams 110 is to define the content of FEC datagrams. It is noted that the SMPTE 2022-5 specification allows for the sender to send data in without being arranged in a grid arrangement. Embodiments of the invention do not assume that received data conforms to a block aligned logical arrangement; however, certain examples may be discussed in that context to facilitate ease of presentation and understanding.

The SMPTE 2022-5/-6 specifications define two types of FEC datagrams, namely a column FEC datagram and a row FEC datagram. The data carried by a column FEC datagram is derived using data carried by the media datagrams of a particular column, while the data carried by a row FEC datagram is derived using data carried by the media datagrams of a particular row.

FIG. 1 depicts four column FEC datagrams 140, namely column FEC datagrams 142, 143, 144, and 145. Column FEC datagrams 140 are calculated by performing XOR operations on media datagrams for a particular column in the logical arrangement of sequence of media datagrams 110. For example, the content of column FEC datagram 142 may be calculated by performing XOR operations on media datagrams 120, 124, 128, and 132, while the content of column FEC datagram 144 may be calculated by performing XOR operations on media datagrams 122, 126, 130, and 134. Note that these XOR operations are defined by the SMPTE 2022-5/-6 specifications, rather than being bitwise XOR operations.

FIG. 1 depicts four row FEC datagrams 150, namely row FEC datagram 152, 153, 154, and 155. Row FEC datagrams 150 are calculated by performing XOR operations on media datagrams for a particular row in the logical arrangement of sequence of media datagrams 110. For example, the content of row FEC datagram 153 may be calculated by performing XOR operations on media datagrams 124, 125, 126, and 127, while the content of row FEC datagram 154 may be calculated by performing XOR operations on media datagrams 128, 129, 130, and 131.

As a consequence of how FEC datagrams are calculated, if only one media datagram has been dropped or is otherwise missing in a particular column, then the column FEC datagram 140 for that column may be used, in conjunction with the other media datagrams in that column, to recover (i.e., reconstruct) the missing media datagram in that column. Similarly, if only one media datagram has been dropped or is otherwise missing in a particular row, then the row FEC datagram 150 for that row may be used, in conjunction with the other media datagrams in that row, to recover (i.e., reconstruct) the missing media datagram in that row.

As used here, the term "covered media packet" refers to a media packet which may be recovered using a column FEC datagram 140 or a row FEC datagram 150. Based on the structure described in the SMPTE 2022-5/-6 specifications, each media packet is covered by exactly one column FEC datagram 140 and is also covered by exactly one row FEC datagram 150. In an embodiment, receiver 200 may receive no FEC streams, only a column FEC stream, or both column and row FEC streams.

Figure 2:
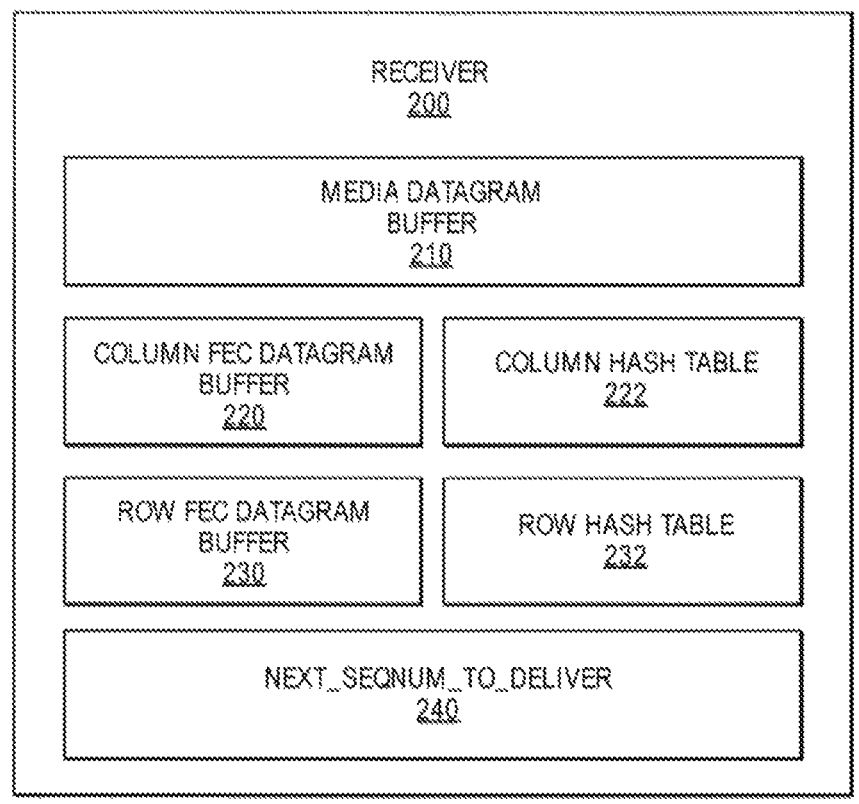
FIG. 2 is an illustration of a media buffer, a column FEC buffer, and a row FEC buffer according to an embodiment of the invention.

FEC processing requires that a number of FEC datagrams be temporarily stored, or buffered, for potential use in the process of media datagram recovery. As media datagrams can arrive out of order, a media buffer 210 at receiver 200 depicted in FIG. 2 is used to temporarily store and buffer media datagrams to facilitate FEC processing. Media buffer 210 can effectively reorder media datagrams; consequently, a separate reorder buffer is not required by embodiments. Similarly, column FEC datagrams 140 and row FEC datagrams 150 are also temporarily stored at receiver 200 in column FEC datagram buffer 220 or row FEC datagram buffer 230 respectively. Media datagram buffer 210, column FEC datagram buffer 220, and row FEC datagram buffer 230 will be described in greater detail below.

FIG. 1 depicts the logical arrangement of the sequence of media datagrams 110 as being a grid of L columns and D rows. L represents the number of media datagrams covered by a single row FEC datagram 150. L also corresponds to the offset between media datagrams covered by a single column FEC datagram. For example, there are 4 columns in the example of FIG. 1, and note that numerical label of media datagrams 120, 124, 128, and 132 in the first column (which may correspond to or represent a sequence number of the media datagram) are each offset by 4. D represents the number of media datagrams covered by a single column FEC datagram 140.

The values of L and D are constrained by the SMPTE 2022-6 specification such that for performing Column Only FEC, the value of L is: $1 \leq L \leq 1020$ and the value of D is: $4 \leq D \leq 255$. For performing Column and Row FEC, the values of L and D are constrained by the SMPTE 2022-6 specification such that the value of L is: $4 \leq L \leq 1020$ and the value of D is: $4 \leq D \leq 255$. For standard definition (SD) signals (270 Mb/s), the product of L and D (L*D) shall be $\leq 1500$. For high definition (HD) signals (1.485 Gb/s), the product of L and D (L*D) shall be $\leq 3000$. For Three Gigabyte (3G) signals (2.97 Gb/s), the product of L and D (L*D) shall be $\leq 6000$.

The term "row FEC SN base" refers to the first sequence number (SN) of a row FEC datagram for a media packet in a row. The row FEC SN base is not necessarily a multiple of L, i.e., SN base % L may or may not be 0. Column FEC SN base is not necessarily a multiple of D, i.e., (SN base/L*L) % D may or may not be 0.

It is observed that, for all media datagrams covered by one row FEC datagram, the value of the sequence number/L is the same or will differ by 1 (with a slight complication due to wrap-around at $2^{16}$). It is further observed that, for all media datagrams covered by the vertically consecutive column FECs, the value of SN % L is the same. Also, for all media datagrams covered by one column FEC, the value of SN/(D*L) is the same or differs by 1 (with a slight complication due to wrap-around at $2^{16}$).

Storing Media Datagrams

The Real-time Transport Protocol (RTP) is a network protocol designed for end-to-end, real-time transfer of streaming media. When a datagram is delivered from a sender to a receiver (such as receiver 200 in FIG. 2) using RTP, the datagram is encapsulated with a RTP header. The RTP header contains two fields of interest to the invention. These fields are sequence number (SN) and timestamp (TS).

The sequence number (SN) is a 16 bit number that is assigned by the sender. The timestamp is a 32 bit number which indicates a logical time when the datagram was sent from the sender. The description below will refer to these two values; however, embodiments of the invention may use sequence numbers and timestamps assigned by or in accordance with other standards or protocols. Therefore, while embodiments shall be chiefly described in terms of using a sequence number and timestamp obtained from the RTP header, the invention is not limited to the use of the RTP protocol.

When a media datagram is received by receiver 200, receiver 200 temporarily stores the media diagram until the media datagram is either delivered downstream or used to recover a missing or lost media datagram. To that end, when a media datagram is received by receiver 200, receiver 200 stores the newly received media datagram in media datagram buffer 210. Similarly, when a FEC datagram is received by receiver 200, receiver 200 temporarily stores the newly received FEC datagram in either column FEC datagram buffer 220 or row FEC datagram buffer 230 in case the newly received FEC datagram is needed to recover a missing or lost media datagram.

FIG. 2 is an illustration of media datagram buffer 210, column FEC datagram buffer 220, and row FEC datagram buffer 230, and certain supporting data structures, according to an embodiment of the invention. Media datagram buffer 210 may be implemented as a circular buffer that is sized to accommodate a number of entries MB_CAP, where:

$$MB\_CAP=MAX(L*D*2, REORDER\_BUFFER\_SIZE)$$

In the above expression, REORDER_BUFFER_SIZE is a completion time configuration constant that will allow for buffering enough media datagrams to mask a certain level of datagram reordering.

Initially, all entries in media datagram buffer 210 are marked invalid. As media datagrams are inserted into media datagram buffer 210, the entries are marked valid.

Media datagrams are inserted into media datagram buffer 210 at a position based on their sequence number. Media datagrams are each associated with a sequence number found in the RTP header. Sequence numbers have a value that ranges between 0 and $65535=2^{16}-1$, inclusive. Media datagram buffer 210 is a circular buffer, and thus, has a wraparound point; to ensure full effectiveness of the buffering with the sequence number wraparound point, MB_CAP may be rounded up such as 65536% MB_CAP==0, which can be ensured by rounding MB_CAP up to the closest power of 2 (less than $2^{16}$).

Media datagram buffer 210 provides random access to its entries based on the RTP packet sequence number by computing the buffer index i as:

$$i = SEQ\_NUM \% MB\_CAP$$

where SEQ_NUM is the RTP packet sequence number being accessed. The sequence number of the next media datagram to be delivered is maintained in a variable named next_seqnum_to_deliver 240. Initially, the variable next_seqnum_to_deliver 240 is assigned the sequence number of the first media datagram that arrives.

Row FEC Datagrams

Row FEC datagrams 150 may be buffered upon arrival at receiver 200, allowing temporary storage to facilitate processing, using row FEC datagram buffer 230 and row hash table 232. Row FEC datagram buffer 230 provides for packet order recovery and is indexed by the sequence number of the row FEC datagram. Row hash table 232 provides for efficient FEC packet lookup based on the hash key computed using the covered media packet sequence number.

Row FEC datagram buffer 230 may be configured to hold a maximum of RFB_CAP entries, where $$RFB\_CAP = MB\_CAP/L = MAX(D*2, REORDER\_BUFFER\_SIZE)$$

Row FEC datagram buffer 230 is a circular buffer, and thus, has a wraparound point; To ensure full effectiveness of row FEC datagram buffer 230 around the row FEC sequence number wrap around point, the capacity of row FEC buffer 230 should be configured such that 65536% RFB_CAP==0, which can be ensured by rounding RFB_CAP up to the closest power of 2 (less than $2^{16}$). The entries of row FEC buffer 230 are indexed directly based on the row FEC datagram sequence number i, where:

$$i = FEC\_SEQ\_NUM \% RFB\_CAP$$

Each time a new row FEC packet is added to row FEC buffer 230 at a particular location (or index), the previously stored row FEC packet at the same location (or index) is removed. An explicit removal may need to be performed in row hash table 232; when doing so, note the corresponding hash table keys may be different between the removed entry and the newly added entry. By using this approach, the number of entries in row hash table 232 will not exceed RFB_CAP entries.

Entries in row hash table 232 entries are addressed using a hash key RFK computed as:

$$RFK(SN) = SN/L$$

where SN is either the sequence number base of the FEC datagram (not the FEC RTP sequence number) or the RTP sequence number of a covered media packet. Row FEC datagrams 150 can be looked up in row hash table 232 by media datagram sequence number through hash key computation as above; however, the needed row FEC datagram may be found in one of up to three entries in row hash table 232. If SEQ_NUM≥L, then the appropriate row FEC datagram is stored in row hash table 232 in the entry identified by key:

$$RFK(SEQ\_NUM) \text{ and } RFK(SEQ\_NUM-L)$$

On the other hand, if SEQ_NUM<L, then this needed FEC datagram is stored in hash table 232 in the entry identified by key:

$$RFK(SEQ\_NUM), FRK(65536+SEQ\_NUM), \text{ and}$$
$$FRK(65536+SEQ\_NUM-L)$$

It is important for lookup operations performed using row FEC datagram buffer 230 to be efficient, both based on the media datagram sequence number and also the row FEC datagram sequence number. Row FEC datagram buffer 230 and row hash table 232 provide a simple constant, O(1), row FEC datagram lookup, both based on the FEC datagram sequence number (direct index into the circular buffer), and based on the media datagram sequence number (through row hash table 232 by checking all of the two or three hash keys listed above).

Column FEC Datagrams

Similar to the row FEC datagrams 150, column FEC datagrams 140 may be temporarily stored in, or buffered, using column FEC datagram buffer 220 and column hash table 222. Column FEC datagram buffer 220 may be implemented as a circular buffer and configured to hold CFB_CAP entries, where $$CFB\_CAP = MB\_CAP/D = MAX(L*2, REORDER\_BUFFER\_SIZE/4)$$

To ensure full effectiveness of a circular buffer with the FEC sequence number wrap around at $2^{16}$, the capacity of column FEC datagram buffer 220 should be rounded up to a power of two. Entries in column FEC datagram buffer 220 are indexed based on the column FEC packet sequence number i, where, $$i = FEC\_SEQ\_NUM \% CFB\_CAP$$

Each time a new column FEC datagram 140 is added to column FEC datagram buffer 220, a previously stored column FEC datagram 140 at the same index is removed. An explicit removal may need to be performed in column hash table 222, as the corresponding hash table keys may be different between the removed entry and the newly added entry. The associated entries in column hash table 222 may be addressed using a key CFK computed as:

$$CFK(SN) = SN/(L*D)*L + SN \% L$$

where SN is either the sequence number base of the FEC packet (not the FEC RTP sequence number) or the sequence number of a covered media packet. A particular column FEC datagram 140 can be looked up using the hash table key computation expression as above, however the needed FEC datagram may be found in one of up to three hash table entries, i.e. the entry with the key:

If SEQ_NUM≥L*D, then $cfk$(SEQ_NUM) and $cfk$(SEQ_NUM−L*D)

If SEQ_NUM≤L*D, then $cfk$(SEQ_NUM), $cfk$(65536+SEQ_NUM), and $$cfk(65536+SEQ\_NUM-L*D)$$

It is important for the lookup operation using column FEC datagram buffer 220 to be efficient, both based on the media datagram sequence number and also based on the column FEC datagram sequence number. Column FEC datagram buffer 220 and column hash table 222 provide constant complexity time, O(1), column FEC datagram lookup, both based on the FEC datagram sequence number (through direct indexing into the circular buffer) and based on the media datagram sequence number (through the column hash table 222 by checking all of the two or three hash keys listed above).

In addition, any datagram lookup operation, be it involving media datagram buffer 210, row FEC datagram buffer 230, or column FEC datagram buffer 220, should involve a RTP timestamp comparison in addition to the sequence number comparison to avoid using stale datagrams.

Media Datagram and FEC Datagram Arrival

Figure 3:
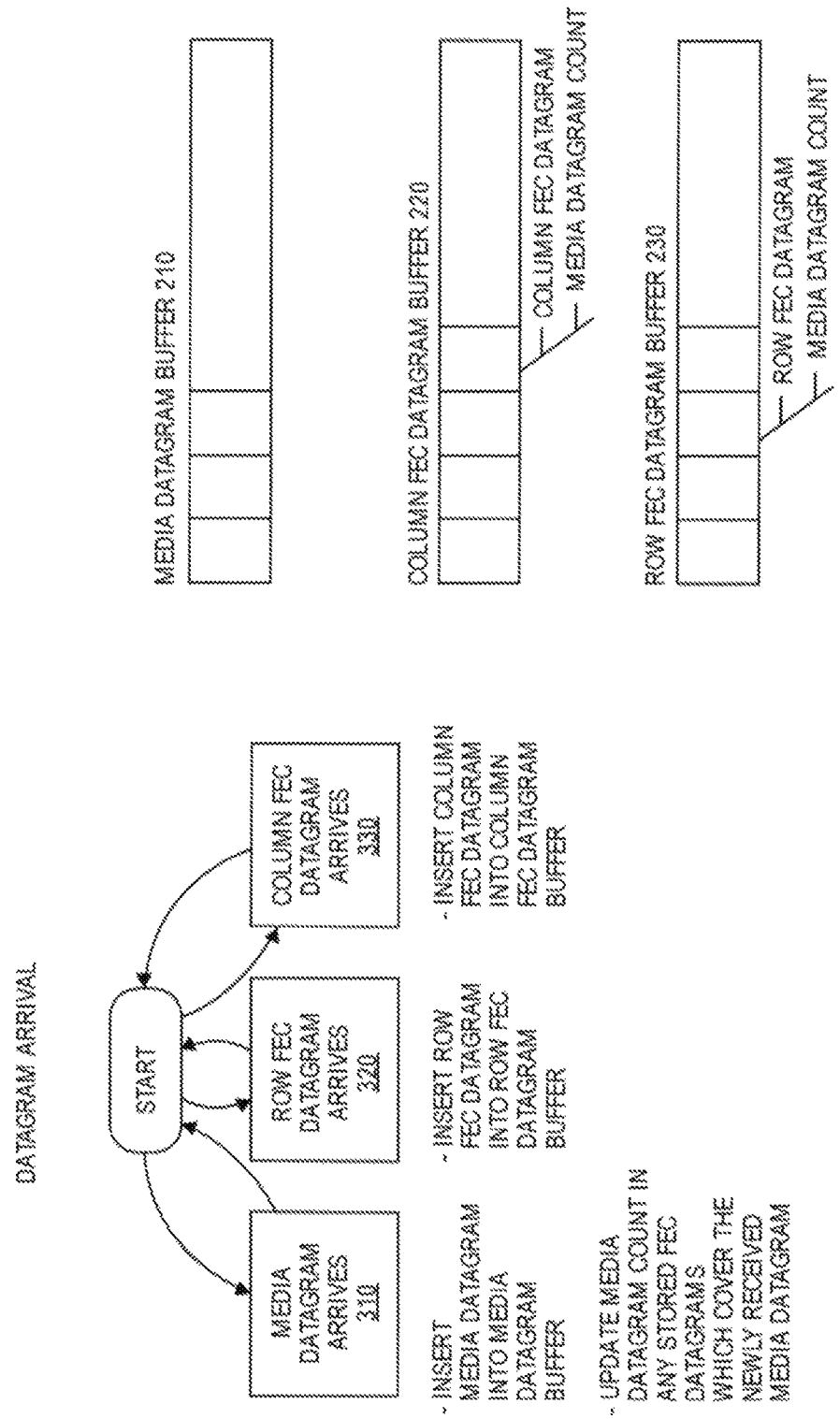
FIG. 3A is a flowchart illustrating the steps of processing a newly received media datagram or FEC datagram according to an embodiment of the invention.
FIG. 3B is a more detailed illustration of certain aspects of the datagram buffers depicted in FIG. 2 according to an embodiment of the invention.

FIG. 3A is a flowchart illustrating the steps of processing a newly received media datagram or FEC datagram according to an embodiment of the invention. The steps of FIG. 3A will be discussed with reference to FIG. 3B, which is a more detailed illustration of certain aspects of the datagram buffers depicted in FIG. 2 according to an embodiment of the invention. Note that there is no implied order to the steps of FIG. 3A, as packets may be received in any order, or indeed not arrive at all, using a packet-based network. Individual steps of FIG. 3A may be performed repeatedly, or may be omitted, before other steps are performed.

In step 310, a media datagram arrives at receiver 200. In response, receiver 200 inserts the newly arrived media datagram into media datagram buffer 210 at the index computed based on the sequence number of the newly arrived media datagram.

Also, in step 310, receiver 200 identifies whether a corresponding column FEC datagram or a corresponding row FEC datagram which covers the newly received media datagram has previously been received. If a corresponding column FEC datagram has previously been received and stored in column FEC datagram buffer 220, then that entry in column FEC datagram buffer 220 is updated by incrementing by one a media datagram count, which is a variable that stores the number of media datagrams received that are covered by that column FEC datagram. Similarly, if a corresponding row FEC datagram has previously been received and stored in row FEC datagram buffer 230, then that entry in row FEC datagram buffer 230 is updated by incrementing the media datagram count for that row FEC datagram by one. In this case, the media datagram count stores the number of media datagrams received that are covered by that row FEC datagram.

In step 320, a row FEC datagram arrives at receiver 200. When a row FEC datagram arrives at receiver 200, receiver 200 inserts the newly arrived row FEC datagram into row FEC datagram buffer 230. Additionally, a media datagram count is established for the row FEC datagram by looking up the associated media buffer entries in media datagram buffer 210 and counting the number of present media datagrams the new arrived row FEC datagram covers.

When notified of a new media datagram, the corresponding row FEC entry will increment the media datagram count. The complexity of adding a row FEC datagram is $O(L)$ due to the counting of the present media datagrams. However, the amortized complexity per media datagram is $O(1)$ since there is one row FEC datagram per L media datagrams.

In step 330, a column FEC datagram arrives at receiver 200. When a column FEC datagram arrives at receiver 200, receiver inserts the newly arrived column FEC datagram into column FEC datagram buffer 220. Additionally, a media datagram count is established for the column FEC datagram by looking up the associated media buffer entries and counting the number of present media datagrams the newly arrived column FEC datagram covers.

When notified of a new media datagram arrival, the corresponding column FEC entry will increment the media datagram count. The complexity of adding a column FEC datagram is $O(D)$ due to the counting of the present media datagrams. However, the amortized complexity per media datagram is $O(1)$ since there is one column FEC datagram per D media datagrams.

Media Datagram Delivery and Recovery

Figure 4:
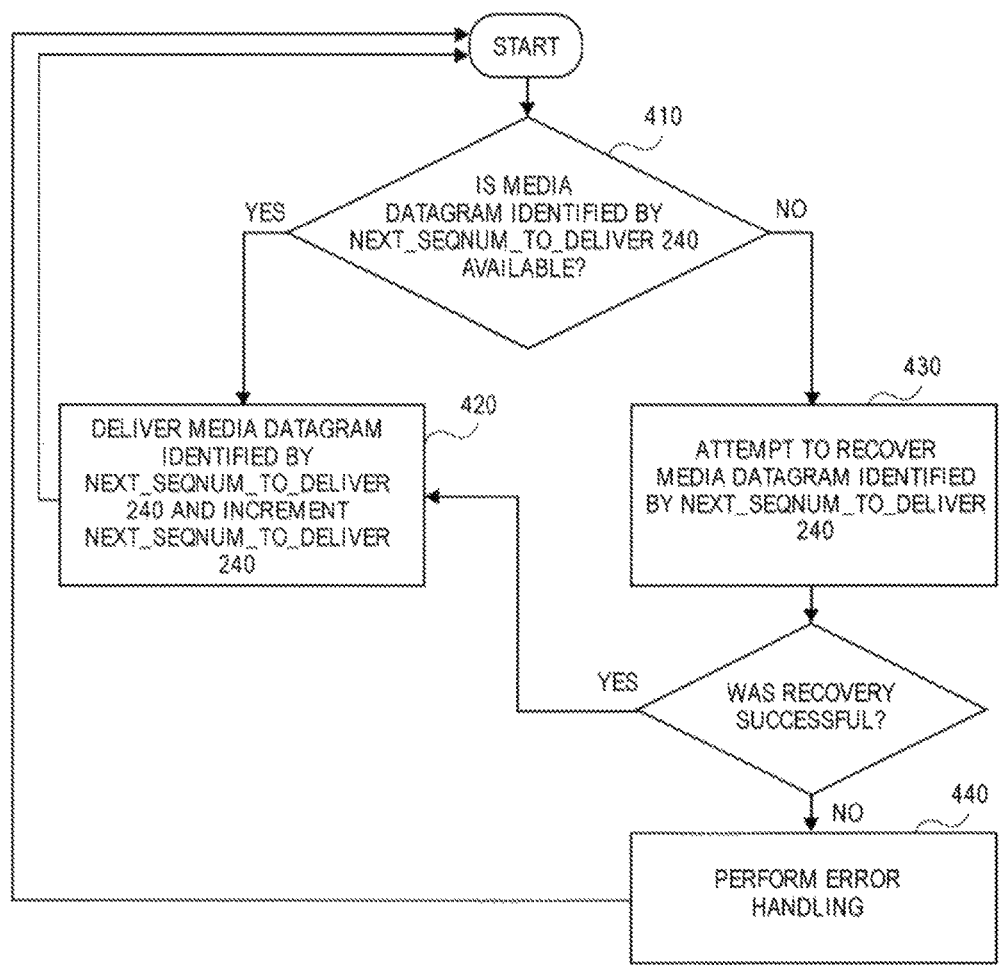
FIG. 4 depicts the steps of delivering and recovering a media datagram according to an embodiment of the invention.

FIG. 4 depicts the steps of delivering and recovering a media datagram according to an embodiment of the invention. As depicted in FIG. 4, if the media datagram identified by the sequence number stored in the variable next_seqnum_to_deliver 240 is stored in media datagram buffer 210 or otherwise available (step 410), then that media datagram is delivered and the variable next_seqnum_to_deliver 240 is incremented (step 420). Otherwise, the media datagram identified by the sequence number stored in the variable next_seqnum_to_deliver 240 is attempted to be recovered using Forward Error Correction (FEC) processing (step 430). This process is repeated until the media datagram identified by next_seqnum_to_deliver 240 is both not available and not recoverable.

Figure 5:
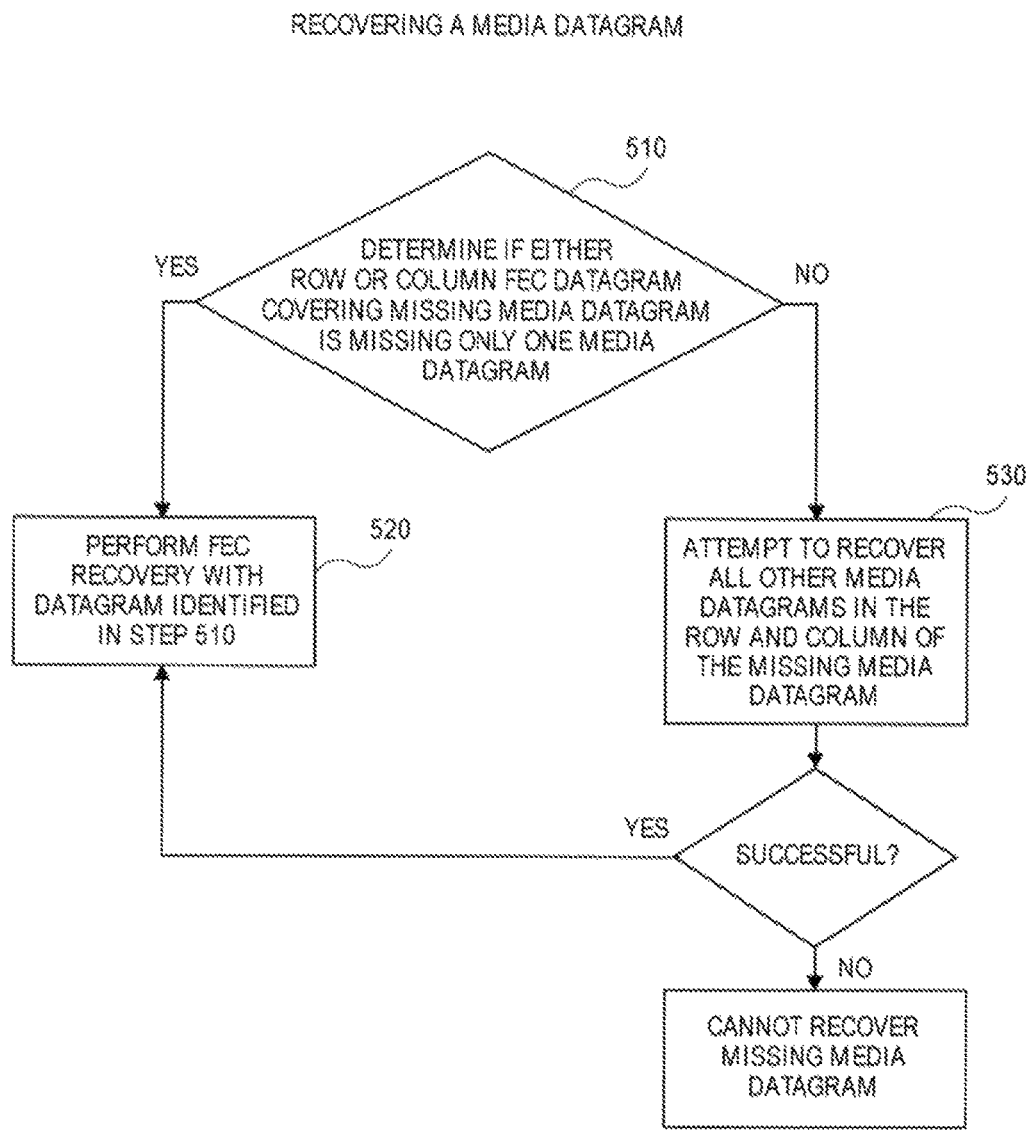
FIG. 5 is a flowchart depicting the steps of recovering a missing media datagram based on the available FEC datagrams according to an embodiment of the invention.

Media datagram recovery performed in step 430 attempts to recover a missing media datagram based on the available FEC datagrams. FIG. 5 is a flowchart depicting the steps of recovering a missing media datagram based on the available FEC datagrams according to an embodiment of the invention.

Initially, in step 510, a consultation is made the media datagram count variable associated with the row and column FEC datagrams covering the missing media datagram. If either of the row and column FEC datagrams covering the missing media datagram is missing only a single media datagram, then in step 520, FEC recovery can be performed using that FEC datagram. Otherwise, in step 530, all other media datagrams in the corresponding row and the corresponding column are recursively attempted to be recovered. If all of other media datagrams in either the corresponding row or in the corresponding column are able to be recovered but for the missing media datagram, then step 520 may be performed. Otherwise, then recovery cannot be performed, and processing may proceed to step 440 of FIG. 4; which shall be described in greater detail below.

In a block aligned FEC configuration (selected by the source of the stream), the recursion level of 1 is sufficient to recover any recoverable media datagrams impairments. However, if the FEC configuration is not block aligned, a deeper recursion may be necessary to recover more complex/chained impairments. For practical reasons, certain embodiments may limit the recursion level to 1.

Recovery of a single media datagram requires (a) L RTP datagram XOR operations with all other row entities present or (b) D RTP datagram XOR operations with all other column entries present. Media datagram recovery in the worst case (of block aligned) FEC configuration involves $L+D-1$ media datagram recoveries (when one whole row and one whole column are missing). A whole row FEC based recovery takes $L*D$ RTP datagram XOR operations. Similarly, a whole column recovery takes $D*L$ XOR operations. Thus, recovery of all media datagrams in a block, in the worst case with a whole row and a whole column missing, is $O(L*D+(D-1)*L)=O(L*D)$. In an amortized sense, the cost of recovering all media datagrams in a block per media datagram is $O(1)$, and it does not depend on the size or the shape of the FEC block.

Media and FEC Streams Synchronization

The media datagram stream, the row FEC datagram stream, and the column FEC datagram stream in general have quite different data rates. While media and FEC buffering may amortize some misalignment in the timestamps of the three streams, it is desirable to keep them somewhat synchronized to avoid one of the streams being too far ahead of the others. Embodiments may perform synchronization of the media datagram stream, the row FEC datagram stream, and the column FEC datagram stream by not reading either of the row FEC datagram stream or the column FEC datagram stream unless their timestamps fall behind the media stream timestamps.

Error Handling

In certain situations, embodiments may not be able to recovery a media packet, as depicted by step 440 of FIG. 4. For example, it may not be possible to recover a media packet when a sequence of media datagrams is lost. A sequence of media datagrams (the sequence starting with next_seqnum_to_deliver and ending with an available media datagram) may become non-recoverable when the fullness of media datagram buffer 210 reaches a higher water mark. Media delivery may continue with the first media datagram that ended the lost sequence. An embodiment may attempt to recover each lost media datagram in the sequence of lost media datagrams, but that is not likely to matter much as one missing datagram of a downstream frame causes the whole frame to be dropped.

As another example, embodiments may not be able to recovery a media packet, and thus step 440 is performed, as a result of a loss of media lock, which can be identified by a non-recoverable sequence of media datagrams spanning the entire capacity of the media datagram buffer 210 with the fullness of media datagram buffer 210 at a high water mark. In an embodiment, delivery of media datagrams would continue with the first media datagrams that arrives afterward.

As another example, embodiments may not be able to recover a media packet, and thus step 440 is performed, in response to a long period of time without receiving new media datagrams, which represents a loss of media lock. The period of time is a compile time constant, e.g., ⅕ of a second. In an embodiment, delivery of media datagrams would continue with the first media datagrams that arrives afterward.

As another example, embodiments may not be able to recovery a media packet, and thus step 440 is performed, in response to a jump in the sequence numbers of media datagrams, which represents a discontinuity in the media stream. The size of the jump is a compile time constant, e.g., $2^{16}/3$. In an embodiment, delivery of media datagrams would continue with the first media datagrams that arrives afterward.

Hardware Mechanisms

Figure 6:
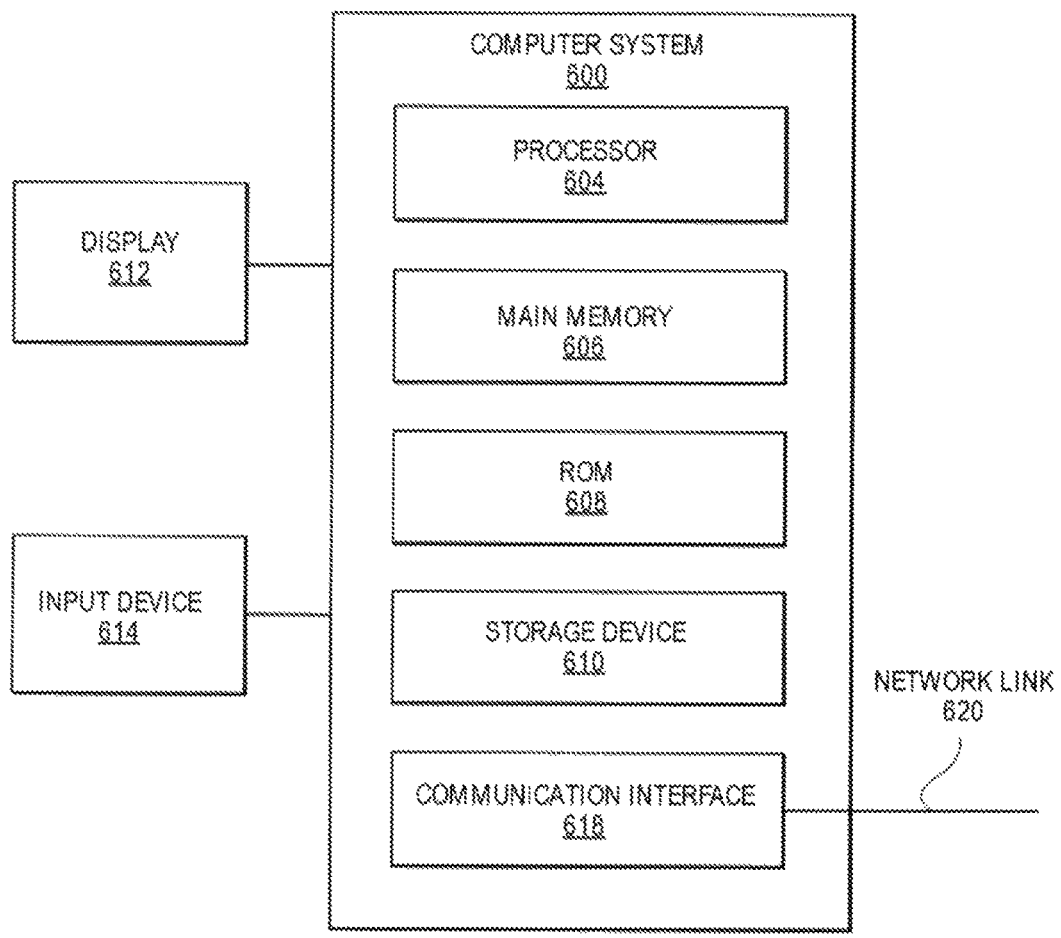
FIG. 6 is a block diagram that illustrates a computer system upon which an embodiment of the invention may be implemented.

In an embodiment, receiver 200 depicted in FIG. 2 may be implemented by one or more computer systems. FIG. 6 is a block diagram that illustrates a computer system 600 upon which an embodiment of the invention may be implemented. In an embodiment, computer system 600 includes processor 604, main memory 606, ROM 608, storage device 610, and communication interface 618. Computer system 600 includes at least one processor 604 for processing information. Computer system 600 also includes a main memory 606, such as a random access memory (RAM) or other dynamic storage device, for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device for storing static information and instructions for processor 604. A storage device 610, such as a magnetic disk or optical disk, is provided for storing information and instructions.

Computer system 600 may be coupled to a display 612, such as a cathode ray tube (CRT), a LCD monitor, and a television set, for displaying information to a user. An input device 614, including alphanumeric and other keys, is coupled to computer system 600 for communicating information and command selections to processor 604. Other non-limiting, illustrative examples of input device 614 include a mouse, a trackball, or cursor direction keys for communicating direction information and command selections to processor 604 and for controlling cursor movement on display 612. While only one input device 614 is depicted in FIG. 6, embodiments of the invention may include any number of input devices 614 coupled to computer system 600.

Embodiments of the invention are related to the use of computer system 600 for implementing the techniques described herein. According to one embodiment of the invention, those techniques are performed by computer system 600 in response to processor 604 executing one or more sequences of one or more instructions contained in main memory 606. Such instructions may be read into main memory 606 from another machine-readable medium, such as storage device 610. Execution of the sequences of instructions contained in main memory 606 causes processor 604 to perform the process steps described herein. In alternative embodiments, hard-wired circuitry may be used in place of or in combination with software instructions to implement embodiments of the invention. Thus, embodiments of the invention are not limited to any specific combination of hardware circuitry and software.

The term "non-transitory machine-readable storage medium" as used herein refers to any tangible medium that participates in storing instructions which may be provided to processor 604 for execution. Non-limiting, illustrative examples of non-transitory machine-readable media include, for example, a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read.

Various forms of non-transitory machine readable media may be involved in carrying one or more sequences of one or more instructions to processor 604 for execution. For example, the instructions may initially be carried on a magnetic disk of a remote computer. The remote computer can load the instructions into its dynamic memory and send the instructions over a network link 620 to computer system 600.

Communication interface 618 provides a two-way data communication coupling to a network link 620 that is connected to a local network. For example, communication interface 618 may be an integrated services digital network (ISDN) card or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through a local network to a host computer or to data equipment operated by an Internet Service Provider (ISP).

Computer system 600 can send messages and receive data, including program code, through the network(s), network link 620 and communication interface 618. For example, a server might transmit a requested code for an application program through the Internet, a local ISP, a local network, subsequently to communication interface 618. The received code may be executed by processor 604 as it is received, and/or stored in storage device 610, or other non-volatile storage for later execution.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A non-transitory computer-readable storage medium that stores one or more sequences of instructions for recovering one or more media datagrams, which when executed by one or more processors, cause:
    receiving a plurality of media datagrams, a plurality of row forward error correction (FEC) datagrams, and a plurality of column FEC datagrams, wherein the plurality of media datagrams is logically arranged in rows and columns of media datagrams, and each row FEC datagram corresponds to one of the rows of the media datagrams and each column FEC datagram corresponds to one of the columns of media datagrams;
    storing each received datagram in a buffer, wherein each of the plurality of media datagrams is stored in a media datagram buffer, wherein each of the plurality of row FEC datagrams is stored in a row FEC datagram buffer, and wherein each of the plurality of column FEC datagrams is stored in a column FEC datagram buffer;
    establishing a media datagram count for a newly arrived row FEC datagram or newly arrived column FEC datagram by counting a number of presently stored media datagrams are covered by the newly arrived row FEC datagram or the newly arrived column FEC datagram;
    upon determining that a particular media datagram is missing, determining if a particular row FEC datagram or a particular column FEC datagram covering the particular media datagram satisfies two conditions, wherein said two conditions are (a) the particular row FEC datagram or the particular column FEC datagram has been received and (b) using said media datagram count associated with said particular row FEC datagram or said particular column FEC datagram to confirm that the particular row FEC datagram or the particular column FEC datagram is missing only a single media datagram for which it covers; and
    upon determining if that the particular row FEC datagram or the particular column FEC datagram covering the particular media datagram has been received and is missing only a single media datagram for which it covers, recovering the particular media datagram using the particular row FEC datagram or the particular column FEC datagram.

2. The non-transitory computer-readable storage medium of claim 1, wherein execution of the one or more sequences of instructions further cause:
    attempting to recover the particular media datagram by recovering one or more media datagrams in the particular row FEC datagram or the particular column FEC datagram other than the particular media datagram.

3. The non-transitory computer-readable storage medium of claim 1, wherein each of the plurality of media datagrams is the media datagram buffer at a location based on sequence number of the inserted media datagram.

4. The non-transitory computer-readable storage medium of claim 1, wherein execution of the one or more sequences of instructions further cause:
    after retrieving an individual datagram from a buffer, determining whether the individual datagram covers the particular media datagram based, at least in part, on a timestamp assigned to the individual datagram.

5. The non-transitory computer-readable storage medium of claim 1, wherein execution of the one or more sequences of instructions further cause:
    upon receiving a newly arrived media datagram, updating said media datagram count for a row FEC datagram or column FEC datagram that covers the newly arrived media datagram.

6. The non-transitory computer-readable storage medium of claim 1, wherein execution of the one or more sequences of instructions further cause:
    upon receiving a newly arrived media datagram, decrementing said media datagram count for a row FEC datagram or column FEC datagram that covers an overridden media datagram previously stored at the location in the media datagram buffer at which the newly arrived media datagram is stored.

7. An apparatus for recovering one or more media datagrams, comprising:
    one or more processors; and
    one or more non-transitory computer-readable storage mediums storing one or more sequences of instructions, which when executed, cause:
        receiving a plurality of media datagrams, a plurality of row forward error correction (FEC) datagrams, and a plurality of column FEC datagrams, wherein the plurality of media datagrams is logically arranged in rows and columns of media datagrams, and each row FEC datagram corresponds to one of the rows of the media datagrams and each column FEC datagram corresponds to one of the columns of media datagrams;
        storing each received datagram in a buffer, wherein each of the plurality of media datagrams is stored in a media datagram buffer, wherein each of the plurality of row FEC datagrams is stored in a row FEC datagram buffer, and wherein each of the plurality of column FEC datagrams is stored in a column FEC datagram buffer;
        establishing a media datagram count for a newly arrived row FEC datagram or newly arrived column FEC datagram by counting a number of presently stored media datagrams are covered by the newly arrived row FEC datagram or the newly arrived column FEC datagram;

upon determining that a particular media datagram is missing, determining if a particular row FEC datagram or a particular column FEC datagram covering the particular media datagram satisfies two conditions, wherein said two conditions are (a) the particular row FEC datagram or the particular column FEC datagram has been received and (b) using said media datagram count associated with said particular row FEC datagram or said particular column FEC datagram to confirm that the particular row FEC datagram or the particular column FEC datagram is missing only a single media datagram for which it covers; and upon determining if that the particular row FEC datagram or the particular column FEC datagram covering the particular media datagram has been received and is missing only a single media datagram for which it covers, recovering the particular media datagram using the particular row FEC datagram or the particular column FEC datagram.

8. The apparatus of claim 7, wherein execution of the one or more sequences of instructions further cause:

attempting to recover the particular media datagram by recovering one or more media datagrams in the particular row FEC datagram or the particular column FEC datagram other than the particular media datagram.

9. The apparatus of claim 7, wherein each of the plurality of media datagrams is the media datagram buffer at a location based on sequence number of the inserted media datagram.

10. The apparatus of claim 7, wherein execution of the one or more sequences of instructions further cause:

after retrieving an individual datagram from a buffer, determining whether the individual datagram covers the particular media datagram based, at least in part, on a timestamp assigned to the individual datagram.

11. The apparatus of claim 7, wherein execution of the one or more sequences of instructions further cause:

upon receiving a newly arrived media datagram, updating said media datagram count for a row FEC datagram or column FEC datagram that covers the newly arrived media datagram.

12. The apparatus of claim 7, wherein execution of the one or more sequences of instructions further cause:

upon receiving a newly arrived media datagram, decrementing said media datagram count for a row FEC datagram or column FEC datagram that covers an overridden media datagram previously stored at the location in the media datagram buffer at which the newly arrived media datagram is stored.

13. A method for recovering one or more media datagrams, comprising:

receiving a plurality of media datagrams, a plurality of row forward error correction (FEC) datagrams, and a plurality of column FEC datagrams, wherein the plurality of media datagrams is logically arranged in rows and columns of media datagrams, and each row FEC datagram corresponds to one of the rows of the media datagrams and each column FEC datagram corresponds to one of the columns of media datagrams;

storing each received datagram in a buffer, wherein each of the plurality of media datagrams is stored in a media datagram buffer, wherein each of the plurality of row FEC datagrams is stored in a row FEC datagram buffer, and wherein each of the plurality of column FEC datagrams is stored in a column FEC datagram buffer;

establishing a media datagram count for a newly arrived row FEC datagram or newly arrived column FEC datagram by counting a number of presently stored media datagrams are covered by the newly arrived row FEC datagram or the newly arrived column FEC datagram;

upon determining that a particular media datagram is missing, determining if a particular row FEC datagram or a particular column FEC datagram covering the particular media datagram satisfies two conditions, wherein said two conditions are (a) the particular row FEC datagram or the particular column FEC datagram has been received and (b) using said media datagram count associated with said particular row FEC datagram or said particular column FEC datagram to confirm that the particular row FEC datagram or the particular column FEC datagram is missing only a single media datagram for which it covers; and upon determining if that the particular row FEC datagram or the particular column FEC datagram covering the particular media datagram has been received and is missing only a single media datagram for which it covers, recovering the particular media datagram using the particular row FEC datagram or the particular column FEC datagram.

14. The method of claim 13, further comprising:

attempting to recover the particular media datagram by recovering one or more media datagrams in the particular row FEC datagram or the particular column FEC datagram other than the particular media datagram.

15. The method of claim 13, wherein each of the plurality of media datagrams is the media datagram buffer at a location based on sequence number of the inserted media datagram.

16. The method of claim 13, further comprising:

after retrieving an individual datagram from a buffer, determining whether the individual datagram covers the particular media datagram based, at least in part, on a timestamp assigned to the individual datagram.

17. The method of claim 13, further comprising:

upon receiving a newly arrived media datagram, updating said media datagram count for a row FEC datagram or column FEC datagram that covers the newly arrived media datagram.

18. The method of claim 13, further comprising:

upon receiving a newly arrived media datagram, decrementing said media datagram count for a row FEC datagram or column FEC datagram that covers an overridden media datagram previously stored at the location in the media datagram buffer at which the newly arrived media datagram is stored.

* * * * *